(12) United States Patent
Ueda et al.

(10) Patent No.: US 7,142,576 B2
(45) Date of Patent: Nov. 28, 2006

(54) SEMICONDUCTOR LASER (75) Inventors: Tetsuo Ueda, Okayama (JP); Keiji Yamane, Bizen (JP); Isao Kidoguchi, Kawanishi (JP); Shoji Fujimori, Bizen (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/198,089

(22) Filed: Aug. 5, 2005

(65) Prior Publication Data

US 2005/0285135 A1 Dec. 29, 2005

Related U.S. Application Data (62) Division of application No. 10/368,206, filed on Feb. 18, 2003, now Pat. No. 6,985,504.

(30) Foreign Application Priority Data

Feb. 19, 2002 (JP) .............................. 2002-042091

(51) Int. Cl.
*H01S 5/00* (2006.01)
(52) U.S. Cl. .............................. 372/43.01; 372/46.012; 372/50.1; 257/57; 257/632; 257/637
(58) Field of Classification Search ............. 372/43.01, 372/50.1, 46.012; 257/57, 632–637
See application file for complete search history.

(56) References Cited

U.S. PATENT DOCUMENTS

| 4,599,729 A | | 7/1986 | Sasaki et al. | |
|---|---|---|---|---|
| 4,731,792 A | * | 3/1988 | Shimizu et al. | 372/49.01 |
| 5,960,021 A | * | 9/1999 | De Vrieze et al. | 372/49.01 |
| 6,067,310 A | * | 5/2000 | Hashimoto et al. | 372/49.01 |
| 6,455,876 B1 | * | 9/2002 | Kikawa et al. | 257/98 |
| 6,519,272 B1 | * | 2/2003 | Baliga et al. | 372/49.01 |
| 6,618,409 B1 | * | 9/2003 | Hu et al. | 372/43.01 |
| 6,798,811 B1 | * | 9/2004 | Sugahara et al. | 372/49.01 |
| 6,893,887 B1 | * | 5/2005 | Yamagata et al. | 438/22 |
| 2002/0115303 A1 | * | 8/2002 | Ohta et al. | 438/765 |
| 2003/0156614 A1 | * | 8/2003 | Ueda et al. | 372/49 |
| 2004/0190576 A1 | * | 9/2004 | Matsuoka et al. | 372/49 |
| 2005/0190807 A1 | * | 9/2005 | Toyama | 372/49.01 |

FOREIGN PATENT DOCUMENTS

| JP | 53-68571 | 6/1978 |
|---|---|---|
| JP | 58-108784 | 7/1983 |
| JP | 03/49281 | 3/1991 |
| JP | 9-326531 | 12/1997 |
| JP | 11-26863 | 1/1999 |
| JP | 11-186656 | 7/1999 |
| JP | 2002-203687 | 2/2004 |

\* cited by examiner

*Primary Examiner*—Armando Rodriguez
*Assistant Examiner*—Delma R. Flores Ruiz
(74) *Attorney, Agent, or Firm*—Hamre, Schumann, Mueller & Larson, P.C.

(57) ABSTRACT

A semiconductor laser includes an active layer formed on a substrate and a pair of cladding layers sandwiching the active layer. On at least one of resonator end faces of the semiconductor laser, a first dielectric film with hydrogen added therein is provided. Between the first dielectric film and the resonator end face, a second dielectric film for suppressing the diffusion of hydrogen is provided. Even when a semiconductor laser with an end face coating film including a hydrogen-added film is exposed to high temperatures, peeling of the end face coating film and deterioration of the end face coating film can be suppressed.

23 Claims, 10 Drawing Sheets

SEMICONDUCTOR LASER

This application is a division of application Ser. No. 10/368,206, filed Feb. 18, 2003 now U.S. Pat. No. 6,985,504, which is incorporated herein by reference.

BACKGROUND OF THE INVENTION

1. Field of the Invention

The present invention relates to a semiconductor laser and a method for manufacturing the same. More particularly, the present invention relates to a method for manufacturing a semiconductor laser with excellent heat resistant properties to avoid the deterioration in qualities of a coating film provided at an end face thereof under high temperature conditions, so that a level of Catastrophic Optical Damage (hereinafter abbreviated as COD) can be reduced and reliability can be improved.

2. Related Background Art

In recent years, recording and reproducing type optical disk devices such as DVD-RAM and CD-R are in increasing demand. GaInP/AlGaInP based semiconductor lasers (emission wavelength: 630 to 680 nm) and AlGaAs based semiconductor lasers (emission wavelength: 780 to 800 nm), which are used as pick-up light sources for such devices, are demanded to have higher output power for higher speed and higher reliability for a stable operation over an extended term.

In the above-stated high-power semiconductor lasers, in order to allow a laser beam to emit effectively from an end face of a resonator, normally, a low-reflection end face coating film is formed on one of the end faces of the resonator, whereas a high-reflection end face coating film is formed on the other end face of the resonator. Here, in the case of a semiconductor laser formed by cleavage, the end face of the resonator denotes a crystal face obtained by the cleavage.

The high-reflection end face coating film normally has a multilayer structure made up of two kinds of dielectrics including a dielectric with a high refractive index such as amorphous silicon and a dielectric with a low refractive index such as alumina or silicon oxide, which are laminated alternately with a thickness of $\lambda/4$ n normally where $\lambda$ and n respectively denote the emission wavelength of a laser beam and the refractive index. Also, the reflectance around 95% is required often for the high-reflection end face coating film, so that the film may be configured with two or three sets of the above-described lamination including two kinds of dielectrics laminated alternately. The dielectrics mentioned here include a dielectric having insulating properties.

Meanwhile, in the high-power semiconductor lasers, with an increase in the optical output, recombination without light emission increases in the vicinity of the resonator end face where the interface state is present. Therefore, the band gap is decreased due to heat, so that a laser beam is absorbed and carriers are generated. Since these carriers generate heat, the band gap is decreased with the increase in temperature, which further causes the absorption of the laser beam. In addition, heat is generated also due to the light absorption by the end face coating film itself, resulting in a decrease in the band gap of the resonator end face.

As a result of such a positive feedback involving the light absorption and the heat generation, finally COD occurs so that the resonator end face of the semiconductor laser melts, resulting in the breakage of a mirror of the resonator. Then, a threshold current increases and optical output properties deteriorate considerably, so that a predetermined high output power cannot be obtained. Especially since an absorption coefficient of a semiconductor laser with a shorter emission wavelength tends to increase, GaInP/AlGaInP based semiconductor lasers with an emission wavelength of 630 to 680 nm are susceptible to such tendency, which hinders the realization of high output power for such semiconductor lasers.

To cope with these problems, JP11(1999)-26863 A discloses that a silicon nitride or amorphous silicon film with hydrogen added therein is formed under an end face coating film to increase the threshold at which COD results. With this configuration, the temperature rise caused by the light absorption at the end face of the laser and hydrogen supplied from the hydrogen supplying film function so that dangling bonds in the vicinity of the resonator end face terminate with hydrogen, whereby the interface state at the resonator end face of the semiconductor laser is inactivated.

Figure 9:
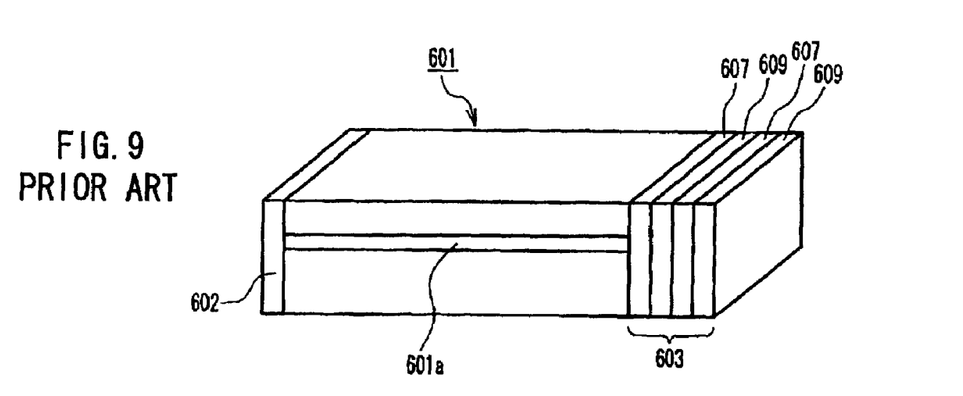
FIG. 9 is a perspective view showing a conventional semiconductor laser provided with end face coating films.

JP 9(1997)-326531 A discloses, as shown in FIG. 9, a semiconductor laser 601 provided with end face coating films 602 and 603, having a configuration for improving the generation level of COD by decreasing the light absorption at the end face coating film 603. Reference numeral 601a denotes an active layer. The end face coating film 603 is made up of a laminated film of a silicon oxide film 607 and a hydrogen-added amorphous silicon film 609, i.e., a configuration in which an amorphous silicon film is substituted with the hydrogen-added amorphous silicon film 609 that has a smaller absorption coefficient.

Figure 10A:
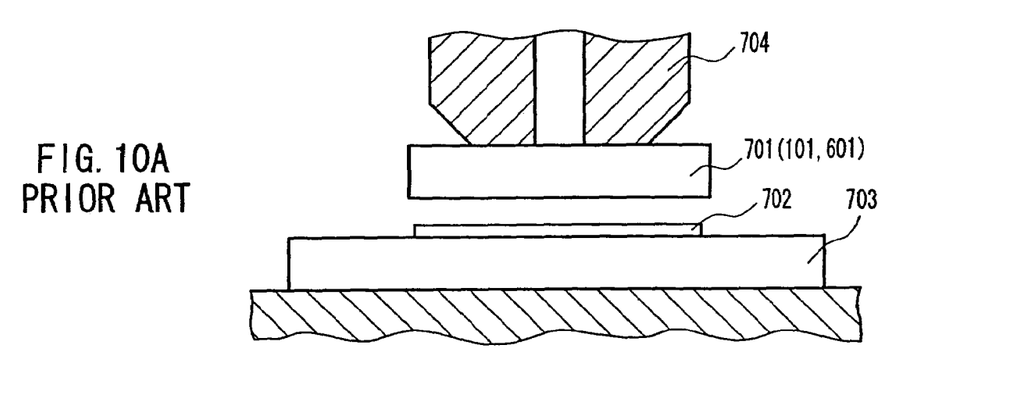
FIG. 10A to 10C are cross-sectional views showing a method of mounting a high-power semiconductor laser.
Figure 10B:
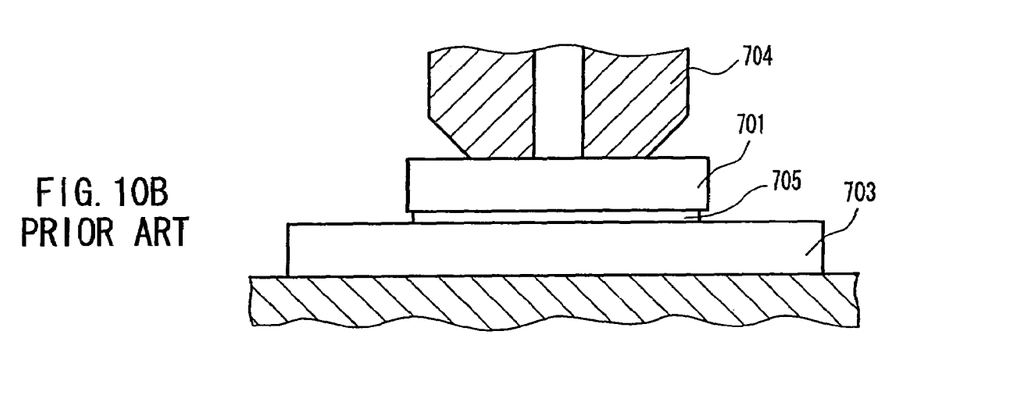
Figure 10C:
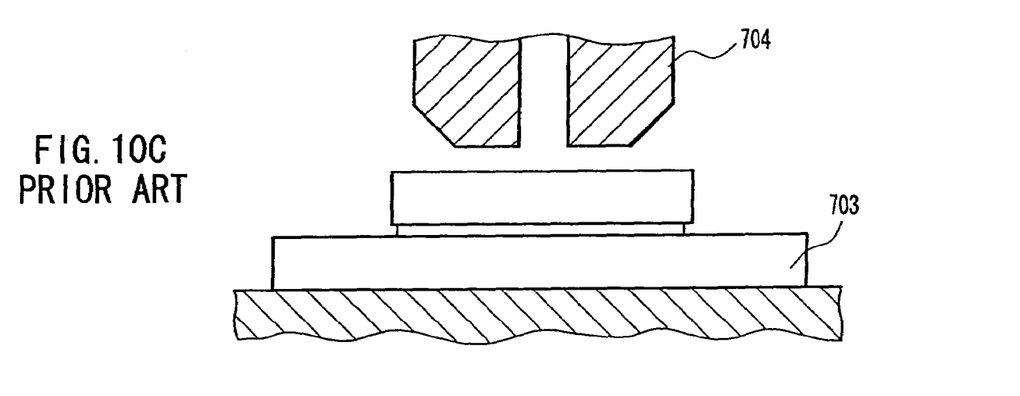

The following describes the mounting of a high-power semiconductor laser, with reference to FIGS. 10A to 10C. In the mounting process, firstly as shown in FIG. 10A, a high-power semiconductor laser element 701 is held by a collet 704 to be mounted on a member such as a sub-mount 703 with solder 702 interposed therebetween. During this process, the sub-mount 703 is heated at a melting point of the solder 702 or higher. After the high-power semiconductor laser element 701 is lowered to the state illustrated in FIG. 10B, the sub-mount 703 and the semiconductor laser 701 are pressed and bonded with each other. After that, the collet 704 is raised as shown in FIG. 10C.

In the above-stated process, when the sub-mount 703 and the semiconductor laser 701 are pressed and bonded with each other, a residual stress tends to be generated due to a load by the collet 704 and the shape of the high-power semiconductor laser element 701. This results from a general configuration of the high-power semiconductor laser 701 in which a resonator length of 0.5 to 1 mm is relatively longer than a width. A semiconductor laser element normally is bonded with a sub-mount at a surface close to the light-emission region in order to have good heat dissipation properties, and therefore the residual stress generated inside the semiconductor laser element also concentrates on a junction with the sub-mount. Thus, a distortion due to the residual stress causes deterioration in laser properties and reliability during a long term operation.

To mitigate such residual stress, some methods are adopted in which the high-power semiconductor laser element 701 is mounted at high temperatures of 200° C. or higher, or after the mounting and under a condition without a load where the collet 704 is released, heat is applied again so as to allow the solder 702 to melt again (to 350° C.).

In this way, in order to realize a semiconductor laser with high output power and a stable operation for a long term, it is effective to suppress the light absorption by using a hydrogen-added film as an end face coating film. Also, it is effective to mitigate the residual stress by mounting a semiconductor laser at high temperatures.

Figure 11:
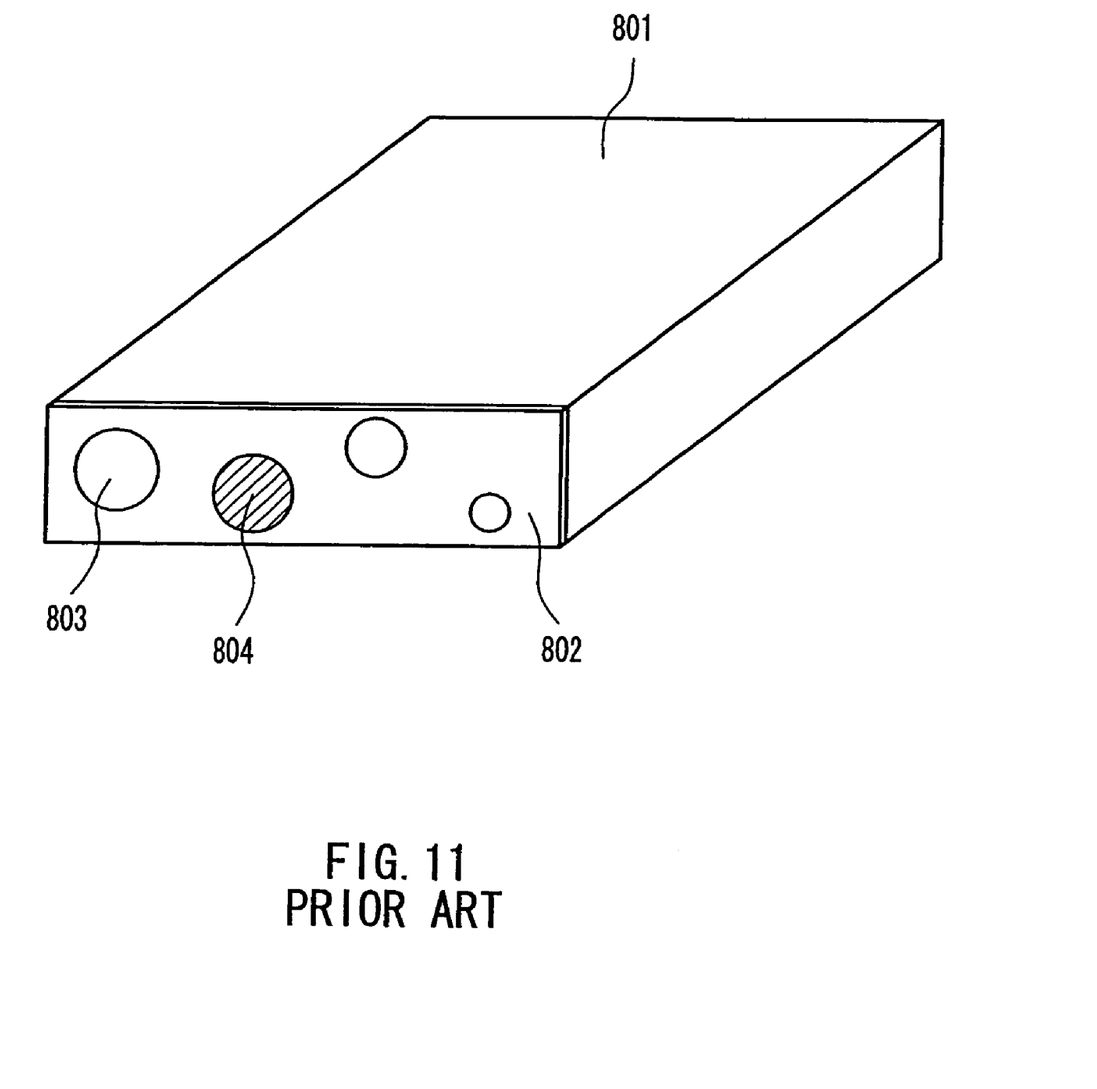
FIG. 11 is a perspective view showing the peeling generated in the end face coating film of a conventional semiconductor laser.

However, when a high-power semiconductor laser is manufactured so as to satisfy the configuration and conditions, it has been found as shown in FIG. 11, that peeling 803 occurs in the end face coating film 802 of the semiconductor laser 801 after the mounting of the semiconductor laser, so that a resonator end face 804 is exposed. It can be considered that this phenomenon occurs due to the following reason: that is, as a result of the exposure of the semiconductor laser provided with the hydrogen-added film as the end face coating film at high temperatures of 200° C. or higher, hydrogen included in the hydrogen-added film is diffused and accumulates between the resonator end face and the end face coating film. This portion swells so that the end face coating film peels off like a blister. If the peeling of the end face coating film occurs, the laser outgoing end face is exposed to the air, and therefore this face is oxidized during a long term operation, which leads to the deterioration of the resonator end face and degrades the reliability.

Furthermore, the hydrogen-added amorphous silicon film, although intended to decrease the absorption coefficient, causes the following problems: that is, the desorption of hydrogen due to the application of heat causes a change in the refractive index of the film, resulting in an increase in the absorption coefficient as well as a change in the end face reflectance, which degrades the generation level of COD and the laser properties.

SUMMARY OF THE INVENTION

Therefore, with the foregoing in mind, it is an object of the present invention to provide a semiconductor laser having a hydrogen-added film in its end face coating films with excellent heat resistant properties and a method for manufacturing the same, by which when the semiconductor laser is exposed to high temperatures, the desorbed hydrogen in the end face coating film can be blocked, so that peeling of the end face coating film and deterioration of the end face coating film can be suppressed.

To cope with the above-described problems, a semiconductor laser of the present invention is provided with a first dielectric film with hydrogen added therein on at least one resonator end face of the semiconductor laser, and a second dielectric film for suppressing diffusion of hydrogen provided between the first dielectric film and the resonator end face.

Preferably, the second dielectric film is provided on both surfaces of the first dielectric film.

Preferably, the second dielectric film includes nitrogen and aluminum. Especially, it is preferable that the second dielectric film is made of silicon nitride (SiN), aluminum nitride (AlN), aluminum oxide ($Al_2O_3$), a composition comprising these materials, or titanium aluminum nitride (AlTiN).

The first dielectric film and the second dielectric film may be adjacent to each other.

It is preferable that a film thickness of the second dielectric film is in a range of 2 nm to 50 nm, inclusive, and more preferably in a range of 5 nm to 50 nm, inclusive.

The first dielectric film may constitute a portion of a reflection film.

When manufacturing a semiconductor laser with one of the above-described configurations, it is preferable to form at least the first dielectric film and the second dielectric film using an electron cyclotron resonance (ECR).

With these configurations, the COD threshold of a high-power semiconductor laser can be raised and a stable operation during a long term of the high-power semiconductor laser can be achieved.

Note here that the statement that a given layer is "on" something in this specification refers to a general location and not a specific location. That is to say, between these elements other elements may be interposed.

DETAILED DESCRIPTION OF THE INVENTION

As a semiconductor laser according to one embodiment of the present invention, for example, a GaInP based semiconductor laser having a size of 0.8 mm in resonator length and 0.3 mm in element width and with an emission wavelength of 650 nm may be used.

In this embodiment, a silicon nitride film having a sufficient capability of blocking hydrogen is used to suppress the diffusion of hydrogen, which causes the problems in the prior art, i.e., peeling of the end face coating film and an increase in the light absorption of the hydrogenated amorphous silicon film. By providing the silicon nitride film in the proximity of the hydrogenated amorphous silicon film, even when a semiconductor laser is heated at high temperatures, the dense silicon nitride film suppresses the diffusion of hydrogen desorbed from the hydrogenated amorphous silicon film.

Figure 1A:
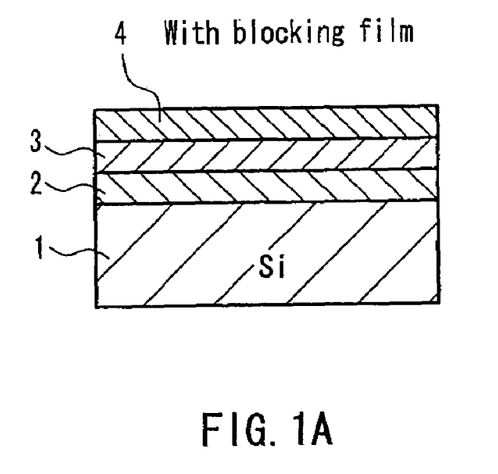
FIGS. 1A and 1B are cross-sectional views showing samples used for verification to confirm the effects of the present invention.
Figure 1B:
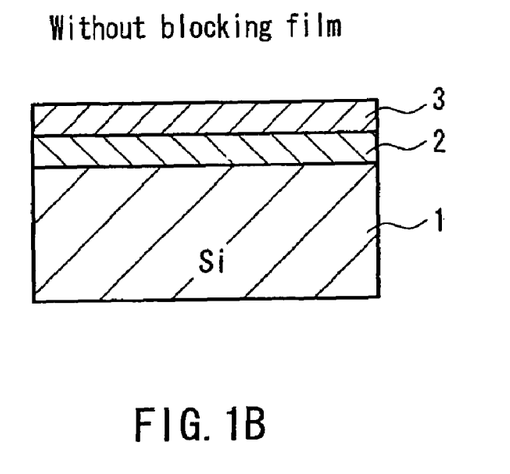

Verifications conducted for finding the cause of the above-described phenomena generated in the end face coating film and for confirming the effects of the present invention will be described below. Firstly, two samples as shown in FIGS. 1A and 1B were manufactured. Both of these samples were manufactured by forming a hydrogen-added amorphous silicon film 2 with a film thickness of 50 nm on a silicon substrate 1 and forming a silicon oxide film 3 with a film thickness of 110 nm thereon. Furthermore, a silicon nitride film 4 of 5 nm in thickness was formed on the silicon oxide film 3 for one of these samples as shown in FIG. 1A, whereas the silicon nitride film 4 was not formed for the other sample as shown in FIG. 1B.

Figure 1C:
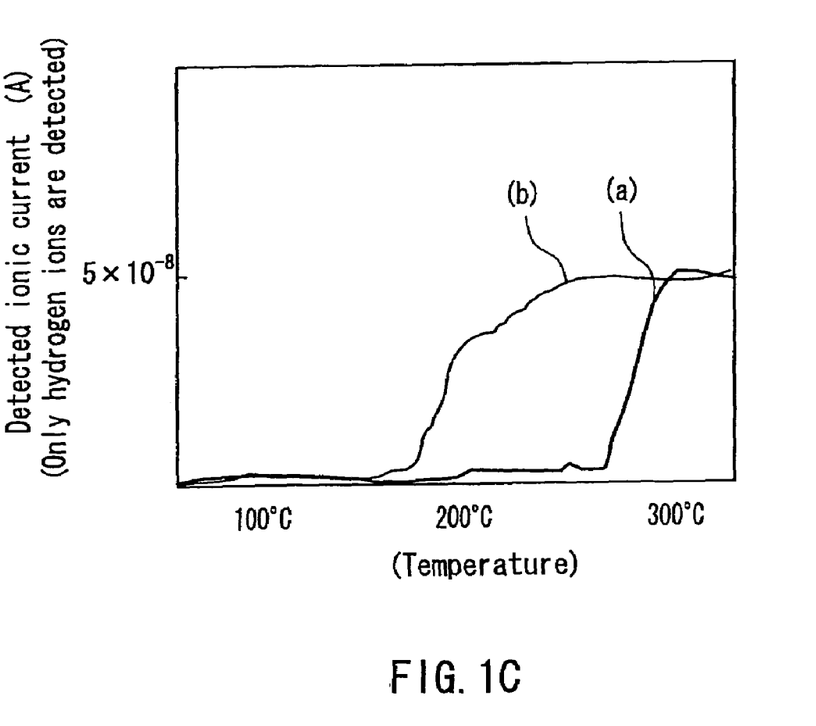
FIG. 1C is a graph showing the results of measuring the amount of desorbed hydrogen from the samples shown in FIGS. 1A and 1B by means of thermal desorption spectroscopy, when these samples are heated.

These two samples were heated, and the amount of hydrogen desorbed from these samples was measured as their temperatures were changed by means of thermal desorption spectroscopy. The results are shown in FIG. 1C. In this chart, a curve (a) represents the result of the sample of FIG. 1A, while a curve (b) represents the result of the sample of FIG. 1B. According to these results, it can be understood that, in the configuration of FIG. 1B, hydrogen starts to be desorbed from the hydrogen-added amorphous silicon film 2 by heating at 200° C. or higher. In FIG. 1C, the detected ionic current on the Y axis denotes a current value obtained only when hydrogen ions are detected in the equipment for the thermal desorption spectroscopy, whereby the flowing amount of hydrogen can be monitored. From this verification, it can be found that hydrogen desorbed from the hydrogen-added amorphous silicon film 2 passes through the silicon nitride film 3 to diffuse to the outside. Therefore, it can be considered that the silicon oxide film 3 does not have a capability of blocking hydrogen. On the other hand, it can be found that in the configuration shown in FIG. 1A, the desorption of hydrogen from the hydrogen-added amorphous silicon film 2 can be suppressed at temperatures reaching 350° C. because the hydrogen-added amorphous silicon film 2 is covered with the silicon nitride film 4 of 5 nm in thickness. Therefore, it can be found that the silicon nitride film 4 has a capability of blocking hydrogen.

The present invention is characterized in that the desorption of hydrogen from the hydrogen-added amorphous silicon film is suppressed by using a dielectric film having a capability of blocking hydrogen.

Embodiment 1

Figure 2:
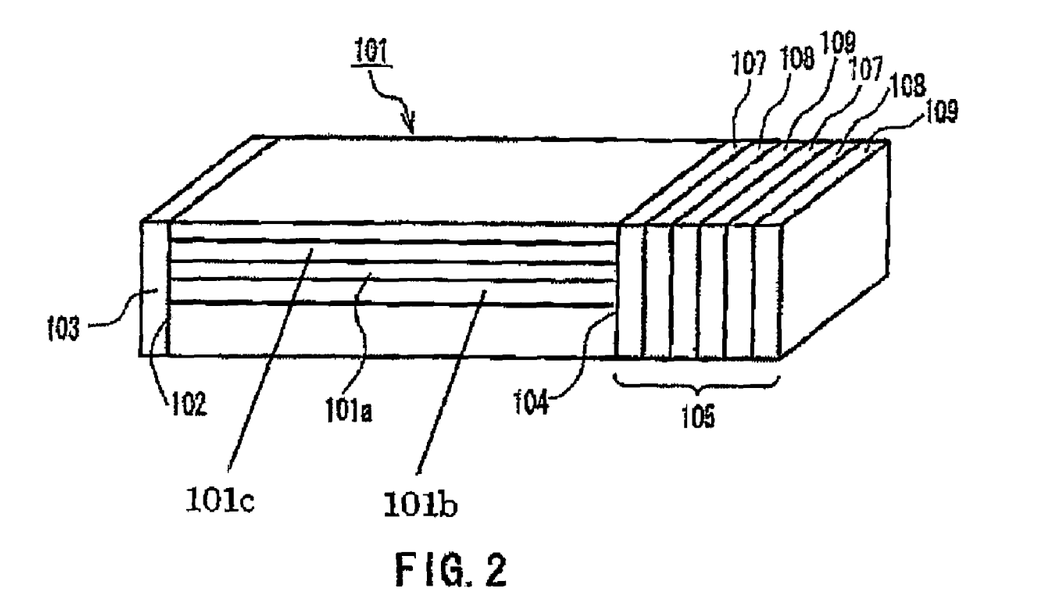
FIG. 2 is a perspective view of a semiconductor laser according to Embodiment 1 of the present invention.

FIG. 2 shows a semiconductor laser 101 according to Embodiment 1 of the present invention. Reference numeral 101a denotes an active layer. The active layer 101a is sandwiched between a pair of cladding layers 101b and 101c. At a resonator end face 102 on the side of mainly emitting a laser beam from the semiconductor laser 101, a low-reflection film 103 is formed as an end face coating film, whereas at a resonator end face 104 on the other side, a high-reflection film 105 is formed as an end face coating film.

The low-reflection film 103 may be made up of a silicon oxide film formed directly on the resonator end face 102, and a film thickness of the low-reflection film 103 is designed so that the end face reflectance becomes about 5%.

The high-reflection film 105 may be made up of six layers including two sets of a silicon oxide film 107 formed directly on the resonator end face 104, a silicon nitride film 108 formed on the silicon oxide film 107 and a hydrogen-added amorphous silicon film 109 formed on the silicon nitride film 108. A film thickness of each film is selected so that the end face reflectance becomes about 90%.

As described above, one of the features of this embodiment resides in that the silicon nitride film 108 is formed between the resonator end face 104 of the semiconductor laser 101 and the hydrogen-added amorphous silicon film 109 that constitutes a part of the high-reflection film 105. As one example, each film has the following film thickness: the silicon oxide film of the low-reflection film 103 and the silicon oxide film 107 respectively are 110 nm in thickness, the silicon nitride film 108 is 5 nm in thickness and the hydrogen-added amorphous silicon film 109 is 50 nm in thickness.

The 90% of the end face reflectance of the high-reflection film 105 is realized by designing the film thickness of each of the silicon oxide film 107 and the hydrogen-added amorphous silicon film 109 equal to $\lambda/4$ n, where $\lambda$ and n respectively denote a wavelength and a refractive index, and by laminating two sets of them. Therefore, depending on the film thickness of the silicon nitride film 108 that is inserted therebetween as a hydrogen blocking layer, the end face reflectance of the high-reflection film 105 might be decreased. To avoid this, in an example according to this embodiment, the film thickness of the silicon nitride film 108 was set at about 5 nm so as not to exert an influence on the end face reflectance. However, as a result of the calculation of the end face reflectance in both cases where the silicon nitride film 108 is included and is not included in the high-reflection film 105, even when the thickness of the silicon nitride film 108 is 10 nm, the reflectance in the former case is 94.1% and that in the latter case is 94.5%, so that there is little significant difference between them. That is, the thickness of the silicon nitride film 108 is not limited to 5 nm, and it can be set as appropriate insofar as the required end face reflectance can be satisfied.

However, if the thickness of the silicon nitride film 108 is 2 nm or less, the capability of blocking hydrogen might deteriorate, and therefore such a range of the thickness is not favorable. In view of the capability of blocking, it is preferable that the thickness of the silicon nitride film 108 is 5 nm or more. On the other hand, if the thickness of the silicon nitride film 108 exceeds 50 nm, delamination might occur due to a stress, and therefore the thickness of 50 nm or less is preferable.

Figure 3A:
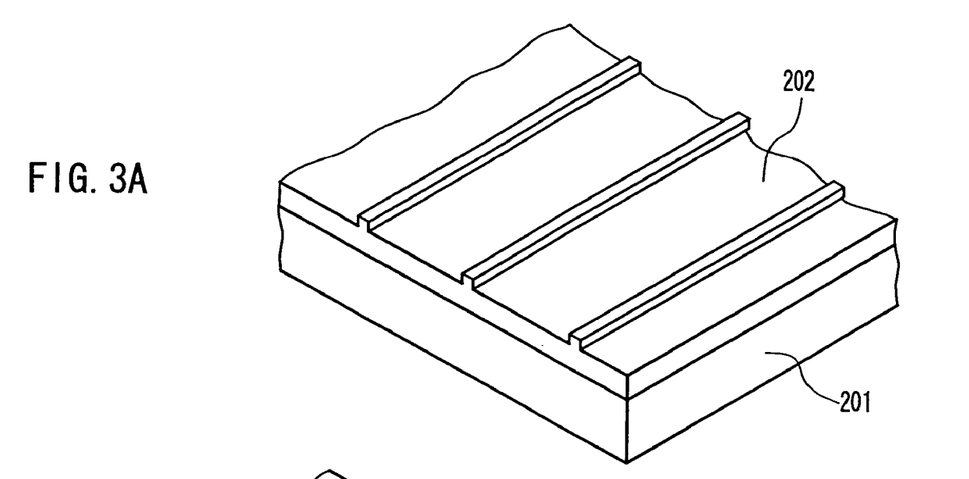
FIGS. 3A to 3C are perspective views showing a process for manufacturing a semiconductor laser according to embodiments of the present invention.
Figure 3B:
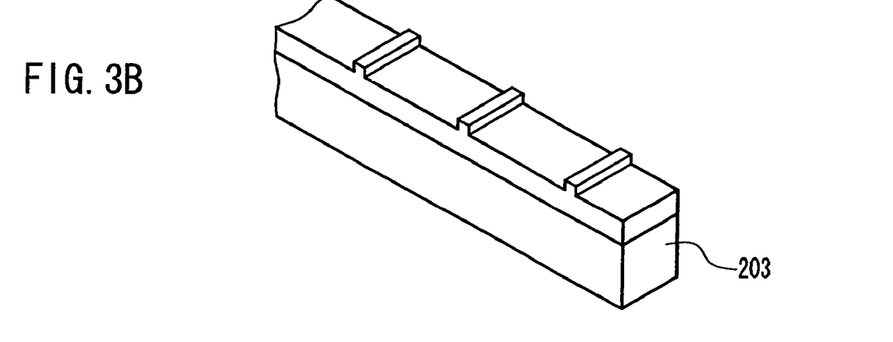
Figure 3C:
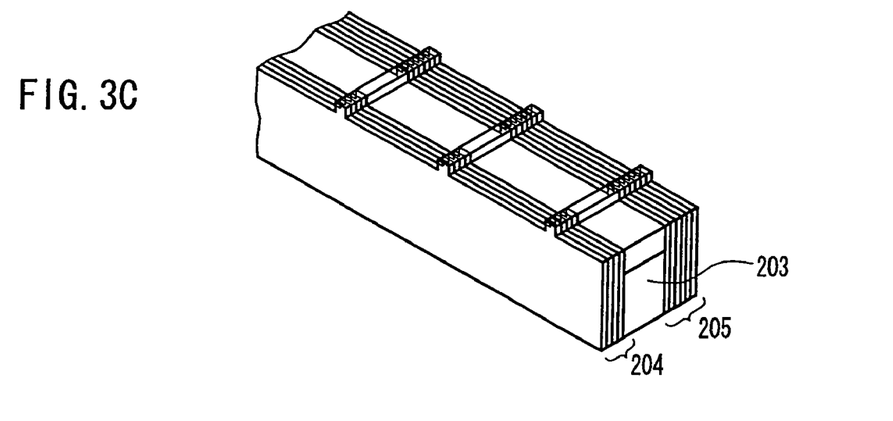

The semiconductor laser 101 according to this embodiment may be manufactured by the following steps. Firstly as shown in FIG. 3A, a compound semiconductor layer including an active layer and a pair of cladding layers sandwiching the active layer is formed on a substrate 201, and further processes are carried out, followed by the step of forming a p-type electrode and a n-type electrode, so as to manufacture a laser wafer 202. Next, as shown in FIG. 3B, the laser wafer 202 is cleaved successively at every resonator length by means of cleaving technology so that a laser bar 203 in which semiconductor lasers are formed side by side is manufactured. Next, as shown in FIG. 3C end face coating films 204 and 205 may be formed on the laser bar 203 by means of an electron cyclotron resonance (hereinafter abbreviated as ECR) plasma sputtering apparatus.

Figure 4:
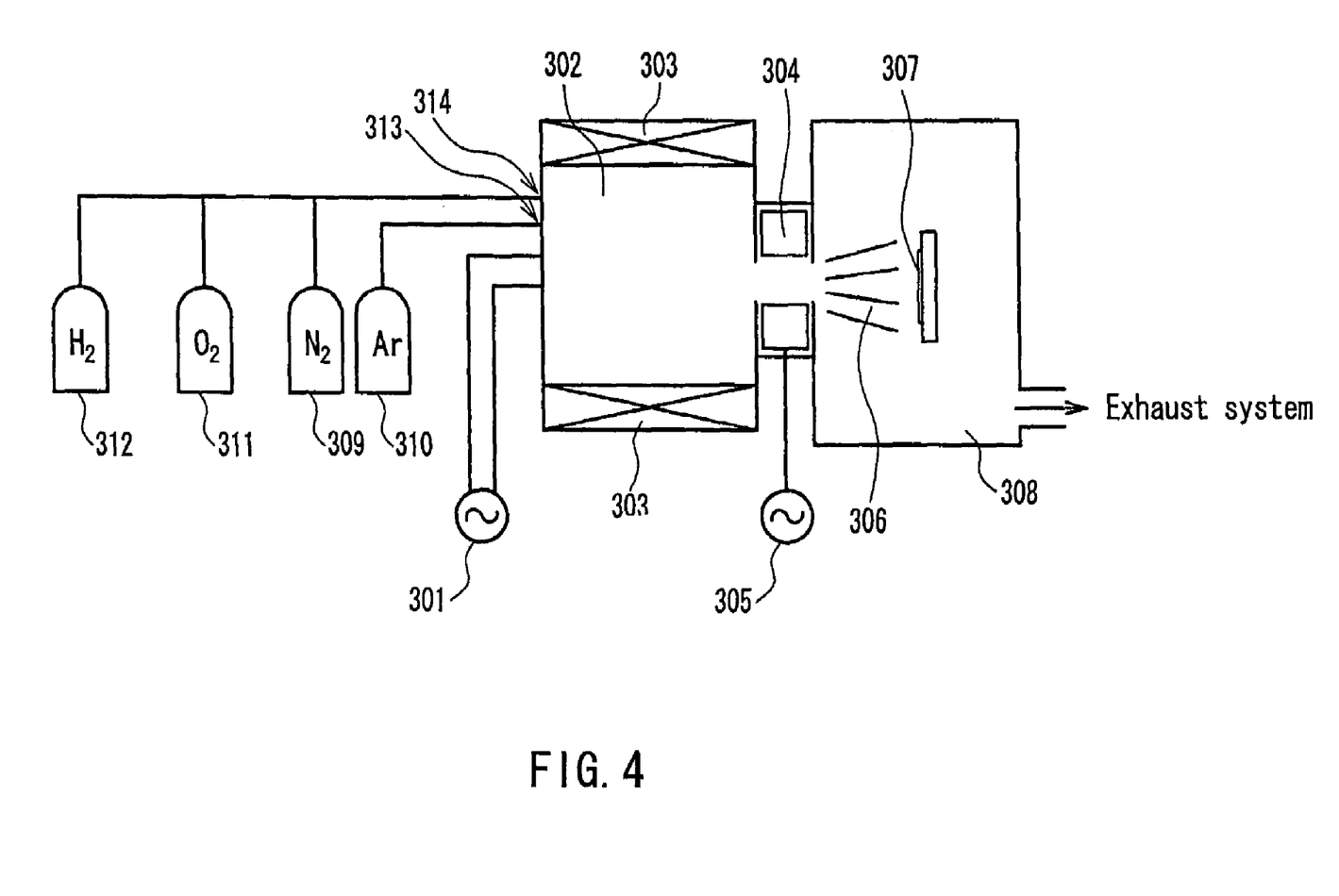
FIG. 4 schematically shows the configuration of an ECR plasma sputtering apparatus used in the process of FIG. 3C.

The configuration of the ECR plasma sputtering apparatus is shown in FIG. 4. A plasma gas inlet 313 and a reactant gas inlet 314 are connected to a plasma generation chamber 302 in which electromagnetic coils 303 are provided. A magnetron 301 also is connected to the plasma generation chamber 302 to generate ECR plasma 306. A thin film deposition chamber 308 further is connected to the plasma generation chamber 302, and a silicon target 304 is provided in a joint portion between the thin film deposition chamber 308 and the plasma generation chamber 302. A RF power source 305 is connected to the silicon target 304. A vacuum pump is connected to the thin film deposition chamber 308.

Figure 5:
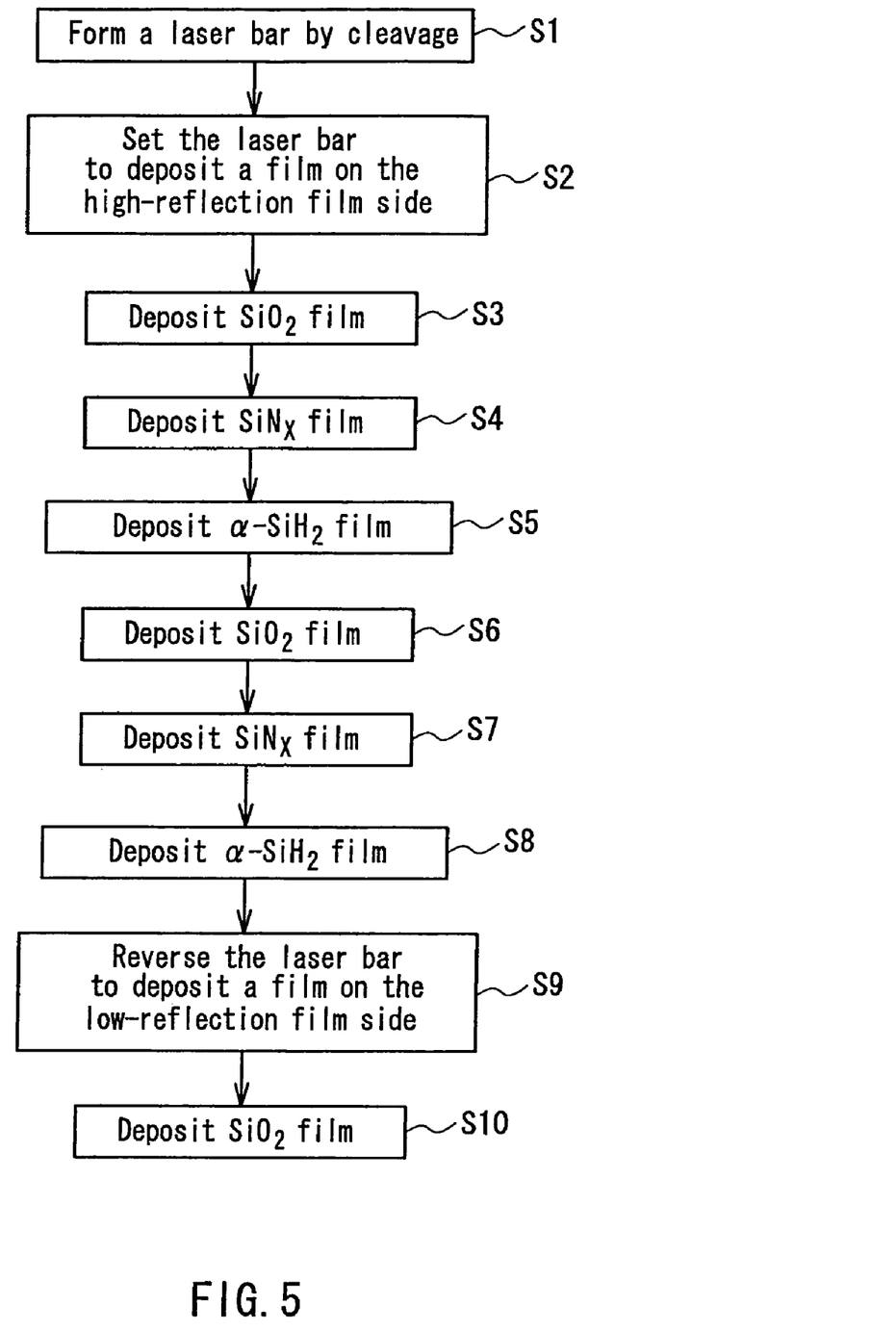
FIG. 5 is a flowchart showing the film formation process for forming an end face coating film of a semiconductor laser according to embodiments of the present invention.

The following describes the formation of the end face coating films 204 and 205, with reference to FIG. 5 that shows a flow of the film formation process. First, in step S1, the laser bar 203 is manufactured by cleavage as shown in FIG. 3B. Next, in step S2, the laser bar 203 is set on a specimen holder 307 in the apparatus shown in FIG. 4 so that one of the end faces of the laser bar 203 is irradiated with the plasma. After that, the high-reflection film 105 shown in FIG. 2 is formed as the end face coating film 205 by the following steps.

In step S3, when the silicon oxide film 107 is formed, while argon gas 310 is introduced at a flow rate of 50 sccm through the plasma gas inlet 313 and while oxygen gas 311 is introduced through the reactant gas inlet 314, 2.45-GHz microwaves induced by the magnetron 301 are introduced so that a magnetic field is formed by the electromagnetic coils 303. Thereby, plasma is generated in the plasma generation chamber 302 by ECR. In addition, a negative bias is applied to the silicon target 304 by the RF power source 305, so that sputtering is performed using ions in the plasma. As a result, silicon and oxygen sputtered from the silicon target 304 are grown onto the resonator end face of the laser bar 203 to deposit the silicon oxide film 107.

Next, in step S4, the silicon nitride film 108 is formed on the silicon oxide film 107. In this case, while the argon gas 310 is introduced at a flow rate of 50 sccm through the plasma gas inlet 313 and while nitrogen gas 309 is introduced through the reactant gas inlet 314, the same process as stated above is performed, so that silicon and nitrogen are grown on the previously formed silicon oxide film 107 to deposit the silicon nitride film 108.

Next, in step S5, the hydrogen-added amorphous silicon film 109 is formed. In this case, while the argon gas 310 is introduced at a flow rate of 50 sccm through the plasma gas inlet 313 and while hydrogen gas 312 is introduced through the reactant gas inlet 314, the same process as stated above is performed, so that silicon and hydrogen are grown on the previously formed silicon nitride film 108 to deposit the hydrogen-added amorphous silicon film 109.

Further, by the similar procedure, a second silicon oxide film 107 (step S6), silicon nitride film 108 (step S7) and hydrogen-added amorphous silicon film 109 are formed successively to form the high-reflection film 105.

The following describes the procedure for forming the low-reflection film 103. First, in step S9, the laser bar 203 is reversed and set on the specimen holder 307 so that the resonator end face 102, which is opposite to the resonator end face 104 on which the high-reflection film 105 has been formed, is irradiated with the plasma. Next, by the same procedure as in the formation of the high-reflection film 105, the silicon oxide film 103 is deposited to form the low-reflection film 103 (step S10).

In the thus manufactured semiconductor laser 101, a laser beam is emitted mainly from the side on which the low-reflection film 103 is formed.

The reason for using the ECR plasma sputtering apparatus in the formation of the end face coating films is that the flatness and the denseness are important for the films. The ECR plasma has a strong directivity, so that reactant species can be supplied vertically onto the specimen, and therefore a film can be deposited uniformly and a flat film can be formed. Also, since the ECR sputtering causes less in damage and does not sputter the deposited film, the flatness of the film as it is deposited can be kept. Especially, even when the silicon nitride film 108 serving as the blocking layer against hydrogen is a thin film so as not to exert an influence on the end face reflectance, the denseness and the flatness can be realized for such a thin film.

Note here that the plasma gas used in the ECR plasma sputtering apparatus may be helium instead of argon. In addition, instead of the silicon target, decomposition of the silane based reactant gas such as mono-silane also may be used for the formation of the hydrogen-added amorphous silicon film 109 and the like.

The end face coating films other than the silicon nitride film 108 may be formed by a magnetron sputtering apparatus and the like. For instance, when the hydrogen-added amorphous silicon film 109 is formed by the magnetron sputtering apparatus, the bonding between silicon and hydrogen becomes weaker than the film formed by the ECR plasma sputtering apparatus. However, according to this embodiment, the silicon nitride film 108 functions so as to block the desorption of hydrogen, and therefore a change in the refractive index and an increase in the absorption coefficient generated due to the desorption of hydrogen can be suppressed.

The film formation process by the ECR plasma sputtering apparatus may be conducted under the application of heat by means of a lamp heater and the like. If the temperature in this process is set at around 200° C., favorable results can be obtained.

Note here that the high-reflection film 105 may include two or more sets of the films, and in such a case a coating film with a higher reflectance can be obtained.

The following describes the behavior of the semiconductor laser 101 according to this embodiment at high temperatures, in comparison with the conventional semiconductor laser 601 as shown in FIG. 9 in which the high-reflection film 605 does not include a silicon nitride film. The conditions of mounting the semiconductor laser 101 and the semiconductor laser 601 are as follows.

As shown in FIG. 10A, the semiconductor laser 101 or the semiconductor laser 601 supported by the collet 704 is placed above the sub-mount 703 on the surface of which the solder 702 made of gold-tin alloy is provided. In this state, the sub-mount 703 is heated at 300° C., which is a melting point of the gold-tin alloy, and then as shown in FIG. 10B the semiconductor laser 101 or the semiconductor laser 601 supported by the collet 704 is lowered on the surface of the sub-mount 703 so as to be bonded with the melting solder 702 under pressure for 1 second. After that, as shown in FIG. 10C, after the collet 704 is allowed to rise, the sub-mount 703 further is heated at 350° C., and after 5 seconds the temperature of it is lowered.

The reason for further heating the sub-mount 703 at 350° C. while allowing the collet 704 to rise is to mitigate the residual stress in the semiconductor laser 101 or the semiconductor laser 601 by melting the solder 702 again without load.

Following the above-described conditions, after mounting the semiconductor laser 101 according to this embodiment and the semiconductor laser 601 that is different only in that the high-reflection film 605 does not include the silicon nitride film 108, the state of the end face coating films of each semiconductor laser was observed with a microscope.

As a result, in either the low-reflection film 103 or the high-reflection film 105 in the semiconductor laser 101 with the silicon nitride film 108 included in the high-reflection film 105, peeling of the end face coating film like a blister was not found. On the other hand, in the semiconductor laser 601 without the silicon nitride film 108 in the high-reflection film 605, there was no change in the low-reflection film 603 but peeling 803 of the end face coating film like a blister as shown in FIG. 11 was found at a large number of portions on the surface of the high-reflection film 605. It was confirmed that the surface 804 exposed by the peeling was a gallium arsenide surface and therefore the peeling was generated at the end face of the resonator.

From these results, as for the semiconductor laser 101 according to this embodiment in which the silicon nitride film 108 is used as the blocking layer against hydrogen, it was confirmed that the exposure of this semiconductor laser at high temperatures around 350° C. does not cause the peeling of the end face coating films.

Embodiment 2

Figure 6:
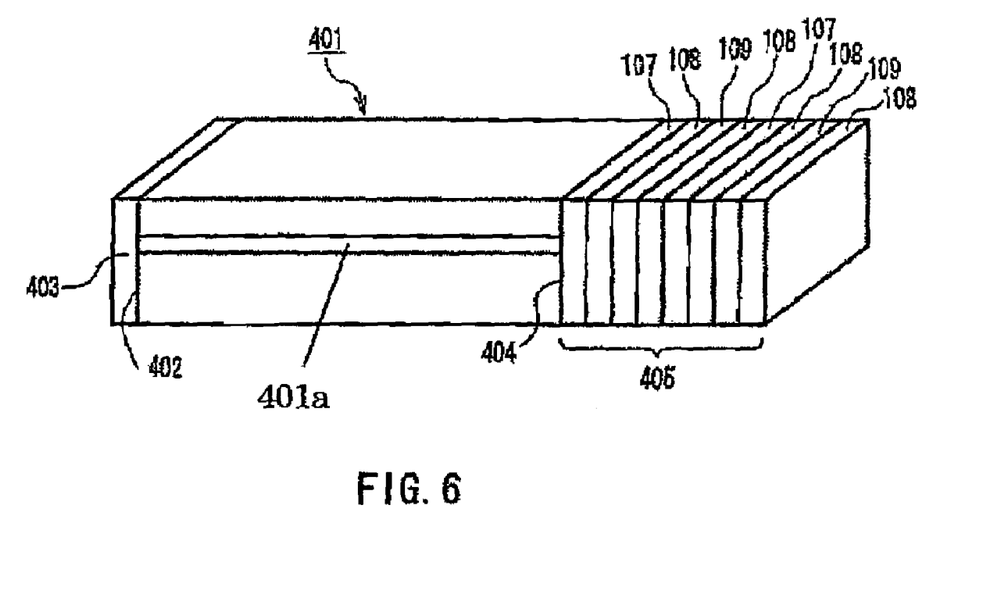
FIG. 6 is a perspective view of a semiconductor laser according to Embodiment 2 of the present invention.

FIG. 6 shows a semiconductor laser 401 according to Embodiment 2 of the present invention. Reference numeral 401a denotes an active layer. This semiconductor laser 401 is different from the semiconductor laser 101 of Embodiment 1 in that a high-reflection film 405 on the side of a resonator end face 404 is made up of eight layers including a first silicon oxide film 107 formed directly on the resonator end face of the semiconductor laser 401, and a first silicon nitride film 108, a first hydrogen-added amorphous silicon film 109, a second silicon nitride film 108, a second silicon oxide film 107, a third silicon nitride film 108, a second hydrogen-added amorphous silicon film 109 and a fourth silicon nitride film 108, which are laminated successively on the first silicon oxide film 107. A low-reflection film 403 on the side of a resonator end face 402 is the same as in Embodiment 1.

One of the features of this embodiment resides in that the silicon nitride films 108 are formed on both surfaces of the hydrogen-added amorphous silicon film 109.

The method for manufacturing the semiconductor laser 401 of this embodiment is substantially the same as that for the semiconductor laser 101 of Embodiment 1.

The experiment was conducted in the same manner as in Embodiment 1 as to the mounting of the semiconductor laser 401 formed according to this embodiment, and as a result of observing the end face coating films after the mounting with a microscope, the peeling 803 of the end face coating film like a blister was not found.

Figure 7:
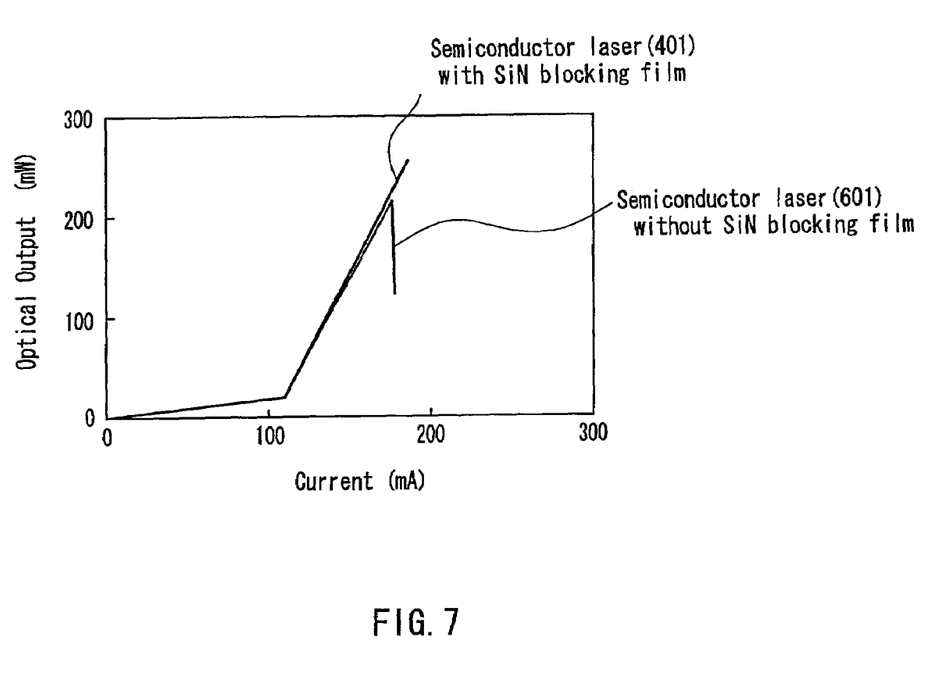
FIG. 7 shows an optical output property of the semiconductor laser according to Embodiment 2 of the present invention.

FIG. 7 shows optical output properties of the semiconductor laser 401 of Embodiment 2 and the semiconductor laser 601 as shown in FIG. 9, which is different from the semiconductor laser 401 only in that the silicon nitride film 108 is not included. According to these properties, the improvement in the threshold of COD by about 10 mW was found in the semiconductor laser 401 of Embodiment 2.

In addition, as a result of the comparison between the end face reflectance of the high-reflection film 405 of the semiconductor laser 401 and that of the high-reflection film 602 of the semiconductor laser 601, the end face reflectance of the semiconductor laser 401 of Embodiment 2 was 94.2%, whereas that of the semiconductor laser 601 without the silicon nitride film 108 was 94.0%.

The following reasons can be considered for these results. Although the hydrogen-added amorphous silicon film is amorphous, dangling bonds thereof terminate with hydrogen. Therefore, its interband energy-level density is reduced, so that the absorption coefficient can be decreased. As for the amorphous silicon film formed by the ECR plasma, the absorption coefficient at, for example, a wavelength of 680 nm of the hydrogen-added amorphous silicon film and the amorphous silicon film without hydrogen added therein is $3 \times 10^2$ cm$^{-1}$ and $5 \times 10^4$ cm$^{-1}$, respectively. In this way, the hydrogen-added amorphous silicon film has a smaller absorption coefficient by two or more digits than the amorphous silicon film without hydrogen added therein. Therefore, when the hydrogen-added amorphous silicon is applied to an end face coating film of a GaInP/AlGaInP based semiconductor laser, heat generation due to the light absorption can be made small, and therefore the COD becomes unlikely to occur.

From this respect, the reason why the COD generation level was improved in the semiconductor laser 401 of Embodiment 2 can be considered as follows: with the configuration of the silicon nitride films 108 sandwiching the hydrogen-added amorphous silicon film 109, even when the exposure at high temperatures causes the disconnection of the hydrogen bonding in the hydrogen-added amorphous silicon film 109, hydrogen does not diffuse because of the blocking capability of the silicon nitride film 108. As a result, the dangling bonds and hydrogen recombine with each other at once to terminate with the hydrogen, and therefore the interband energy-level is made small and the absorption coefficient is not increased.

Although the case adopting the silicon nitride as a material having a capability of blocking hydrogen is described with reference to this embodiment, such a capability of blocking hydrogen was confirmed as to aluminum nitride, aluminium oxide and a compound of these materials. In addition, titanium nitride and titanium aluminium nitride (TiAlN) also have a great effect of blocking hydrogen.

Embodiment 3

Figure 8:
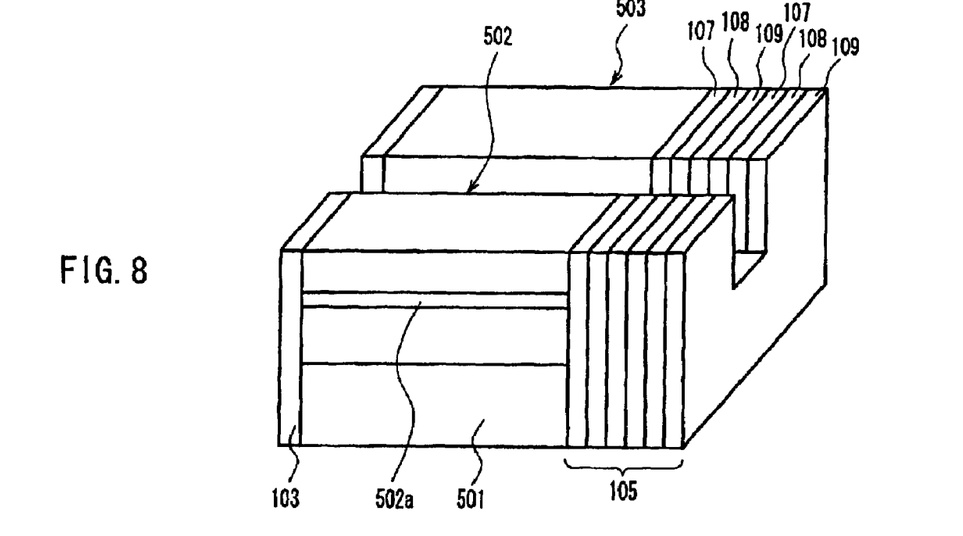
FIG. 8 is a perspective view of a semiconductor laser according to Embodiment 3 of the present invention.

FIG. 8 shows a semiconductor laser according to Embodiment 3 of the present invention. This semiconductor laser has a configuration in which two semiconductor laser elements 502 and 503 are formed monolithically on the same substrate 501. Reference numeral 502a denotes an active layer of the semiconductor laser element 502. The semiconductor laser elements 502 and 503 may be configured so as to emit laser beams with different emission wavelengths from each other.

With respect to the resonator end faces of the semiconductor laser with such a configuration also, the end face coating film is applicable in the same manner as in the above-described embodiments. FIG. 8 shows a state in which the same low-reflection film 103 and the high-reflection film 105 as in FIG. 1 are formed.

In FIG. 8, the low-reflection film 103 and the high-reflection film 105 are formed as films common to the semiconductor laser elements 502 and 503. This is because a considerably minute space between the semiconductor laser elements 502 and 503 makes the formation of different end face coating films for each semiconductor laser element difficult. Ideally, since the wavelengths of the semiconductor laser elements 502 and 503 are different from each other, different end face coating films should be formed for each element. However, depending on the properties required for the wavelength of each semiconductor laser element and for their emitted laser beams, conditions can be set so as to form a reflection film using a common film without any problems in practical use. In such a case, the configuration of FIG. 8 is effective.

As stated above, according to the present invention, the following effects can be obtained.

First, even when hydrogen, which is effective for increasing the COD threshold level of a high-power semiconductor laser, is desorbed by the exposure of the semiconductor laser to high temperatures, the hydrogen does not accumulate between the resonator end face and the end face coating film and that portion does not expand by heat, whereby the peeling of the end face coating film or the like does not occur.

In addition, even when hydrogen, which is effective for increasing the COD threshold level of a high-power semiconductor laser, is desorbed by the exposure of the semiconductor laser at high temperatures, the hydrogen does not diffuse by virtue of the blocking layer. As a result, dangling bonds from which the hydrogen bonding has been disconnected are terminated with hydrogen again, so that the semiconductor laser does not suffer from the heat generated due to an increase in the light absorption, a change in the reflectance due to the change in the refractive index and the like.

Furthermore, by manufacturing the end face coating films using ECR plasma CVD apparatus that enables the formation of a dense and flat film even in the case of a thin film, the silicon nitride film that is inserted as a blocking layer can be formed to have a film thickness that does not significantly influence the end face reflectance but has a sufficient capability of blocking hydrogen.

From these effects, even in the case of a change in the surroundings such as the mounting at high temperatures, the end face coating films do not deteriorate, and therefore the threshold level for suppressing the COD and the reliability during a long term operation can be improved, whereby a high-power semiconductor laser with a high quality can be realized.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor laser comprising an active layer formed on a substrate, and a pair of cladding layers sandwiching the active layer,
   wherein a first dielectric film with hydrogen added therein is provided on at least one resonator end face,
   a second dielectric film for suppressing diffusion of hydrogen is provided between the first dielectric film, and the resonator end face, with a thickness being set so as not to exert a substantial influence on the end face reflectance, and
   a third dielectric film allowing hydrogen to pass therethrough is provided between the resonator end face and the second dielectric film.

2. The semiconductor laser according to claim 1, wherein the third dielectric film comprises silicon oxide.

3. The semiconductor laser according to claim 1, wherein the second dielectric film comprises nitrogen and aluminum.

4. The semiconductor laser according to claim 1, wherein the second dielectric film is made of a material selected from the group consisting of silicon nitride (SiN), aluminum nitride (AlN), aluminum oxide ($Al_2O_3$), a composition comprising these materials and titanium aluminum nitride (AlTiN).

5. The semiconductor laser according to claim 1, wherein a film thickness of the second dielectric film is in a range of 2 nm to 50 nm, inclusive.

6. A semiconductor laser comprising an active layer formed on a substrate, and a pair of cladding layers sandwiching the active layer,
   wherein at least one of resonator end faces is provided with two or more sets of a third dielectric film, a second dielectric film and a first dielectric film which are disposed in this order from the resonator end face,
   the third dielectric film allows hydrogen to pass therethrough,
   the second dielectric film suppresses diffusion of hydrogen and has a thickness being set so as not to exert a substantial influence on the end face reflectance, and
   the first dielectric film has added hydrogen.

7. The semiconductor laser according to claim 6, wherein the third dielectric film comprises silicon oxide.

8. The semiconductor laser according to claim 6, wherein the second dielectric film comprises nitrogen and aluminum.

9. The semiconductor laser according to claim 6, wherein the second dielectric film is made of a material selected from the group consisting of silicon nitride (SiN), aluminum nitride (AlN), aluminum oxide ($Al_2O_3$), a composition comprising these materials and titanium aluminum nitride (AlTiN).

10. The semiconductor laser according to claim 6, wherein a film thickness of the second dielectric film is in a range of 2 nm to 50 nm, inclusive.

11. A semiconductor laser comprising an active layer formed on a substrate, a pair of cladding layers sandwiching the active layer, and a multilayer structure formed on at least one of resonator end faces, the multilayer structure including a first dielectric film and a third dielectric film having refractive indexes different from each other,
    wherein the first dielectric film has added hydrogen,
    the third dielectric film allows hydrogen to pass therethrough, and
    at least one second dielectric film for suppressing diffusion of hydrogen is provided between the first and the third dielectric layers, the thickness of the second dielectric film being set so as not to exert a substantial influence on the end face reflectance.

12. The semiconductor laser according to claim 11, wherein the resonator end face and the third dielectric film are adjacent to each other.

13. The semiconductor laser according to claim 11, wherein the second dielectric films are provided on both surfaces of the first dielectric film so as to be adjacent to the first dielectric film.

14. The semiconductor laser according to claim 11, wherein the third dielectric film comprises silicon oxide.

15. The semiconductor laser according to claim 11, wherein the second dielectric film comprises nitrogen and aluminum.

16. The semiconductor laser according to claim 11, wherein the second dielectric film is made of a material selected from the group consisting of silicon nitride (SiN), aluminum nitride (AlN), aluminum oxide (Al203), a composition comprising these materials and titanium aluminum nitride (AlTiN).

17. The semiconductor laser according to claim 11, wherein a film thickness of the second dielectric film is in a range of 2 nm to 50 nm, inclusive.

18. The semiconductor laser according to claim 17, wherein the film thickness of the second dielectric film is in a range of 5 nm to 50 nm, inclusive.

19. A semiconductor laser comprising an active layer formed on a substrate, and a pair of cladding layers sandwiching the active layer,
    wherein a first dielectric film with hydrogen added therein is provided on at least one resonator end face,
    a second dielectric film for suppressing diffusion of hydrogen is provided between the first dielectric film and the resonator end face, with a thickness in a range of 2 nm to 10 nm, inclusive, and
    a third dielectric film allowing hydrogen to pass therethrough is provided between the resonator end face and the second dielectric film.

20. A semiconductor laser comprising an active layer formed on a substrate, and a pair of cladding layers sandwiching the active layer, wherein at least one resonator end face is provided with two or more sets of a third dielectric film, a second dielectric film and a first dielectric film, which are disposed in this order from the resonator end face, the third dielectric film allows hydrogen to pass therethrough, the second dielectric film suppresses diffusion of hydrogen and has a thickness in a range of 2 nm to 10 nm, inclusive, and the first dielectric film has added hydrogen.

21. A semiconductor laser comprising an active layer formed on a substrate, a pair of cladding layers sandwiching the active layer, and a multilayer structure formed on at least one of resonator end face, the multilayer structure including a first dielectric film and a third dielectric film having refractive indexes different from each other, wherein the first dielectric film has added hydrogen, the third dielectric film allows hydrogen to pass therethrough, and at least one second dielectric film for suppresses diffusion of hydrogen is provided between the first and the third dielectric layers, with a thickness in a range of 2 nm to 10 nm, inclusive.

22. The semiconductor laser according to claim 21, wherein the resonator end face and the third dielectric film are adjacent to each other.

23. The semiconductor laser according to claim 22, wherein the second dielectric film is provided on both surfaces of the first dielectric film so as to be adjacent to the first dielectric film.

* * * * *